(12) United States Patent
Klocke (10) Patent No.: US 7,794,573 B2
(45) Date of Patent: Sep. 14, 2010

(54) SYSTEMS AND METHODS FOR ELECTROCHEMICALLY PROCESSING MICROFEATURE WORKPIECES

(75) Inventor: John L. Klocke, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 1283 days.

(21) Appl. No.: 11/218,324

(22) Filed: Aug. 31, 2005

(65) Prior Publication Data

US 2006/0144699 A1 Jul. 6, 2006

Related U.S. Application Data

(63) Continuation-in-part of application No. 10/729,349, filed on Dec. 5, 2003, now Pat. No. 7,351,314, and a continuation-in-part of application No. 10/729,357, filed on Dec. 5, 2003, now Pat. No. 7,351,315, and a continuation-in-part of application No. 10/861,899, filed on Jun. 3, 2004, now Pat. No. 7,585,398, which is a continuation-in-part of application No. 10/729,349, and a continuation-in-part of application No. 10/729,357.

(60) Provisional application No. 60/607,460, filed on Sep. 3, 2004.

(51) Int. Cl.
*C25D 17/00* (2006.01)
*C25F 7/00* (2006.01)
*C25D 7/12* (2006.01)
*C25F 3/02* (2006.01)

(52) U.S. Cl. ............... 204/234; 204/236; 204/237; 204/239; 204/262; 204/263; 204/265; 204/266; 205/99; 205/101; 205/650

(58) Field of Classification Search ............... None
See application file for complete search history.

(56) References Cited

U.S. PATENT DOCUMENTS

| | | | | |
|---|---|---|---|---|
| 3,688,911 A | * | 9/1972 | Baerg | 210/321.78 |
| 3,841,382 A | * | 10/1974 | Gravis et al. | 159/16.1 |
| 4,078,976 A | * | 3/1978 | Spears, Jr. | 203/10 |
| 4,102,756 A | * | 7/1978 | Castellani et al. | 205/82 |

(Continued)

FOREIGN PATENT DOCUMENTS

JP 59-150094 8/1984

(Continued)

OTHER PUBLICATIONS

Office Action issued by the Japanese Patent Office on May 26, 2008 in Japanese Patent Application No. 2003-500322.

*Primary Examiner*—Harry D Wilkins, III
(74) *Attorney, Agent, or Firm*—Kenneth H. Ohriner; Perkins Coie LLP (57) ABSTRACT

Systems and methods for electrochemically processing microfeature workpieces are disclosed herein. In one embodiment, a system includes (a) a processing unit having a first flow system configured to convey a flow of a first processing fluid to a microfeature workpiece, (b) an electrode unit having an electrode and a second flow system configured to convey a flow of a second processing fluid at least proximate to the electrode, (c) a barrier between the processing unit and the electrode unit to separate the first and second processing fluids, and (d) a water balance unit for maintaining the concentration of water in the first processing fluid within a desired range.

15 Claims, 8 Drawing Sheets

U.S. PATENT DOCUMENTS

| | | | | |
|---|---|---|---|---|
| 5,352,350 A | * | 10/1994 | Andricacos et al. | 205/101 |
| 6,471,845 B1 | * | 10/2002 | Dukovic et al. | 205/81 |
| 2001/0032788 A1 | * | 10/2001 | Woodruff et al. | 205/687 |
| 2004/0108200 A1 | * | 6/2004 | Des Jardins et al. | 204/228.6 |
| 2004/0134775 A1 | * | 7/2004 | Yang et al. | 204/296 |

FOREIGN PATENT DOCUMENTS

| | | |
|---|---|---|
| JP | 2200800 | 8/1990 |
| JP | 03-103840 | 11/1992 |
| JP | 7197299 | 8/1995 |
| JP | 11-350185 | 12/1999 |
| JP | 2000-087299 | 3/2000 |
| JP | 2000-256896 | 9/2000 |
| JP | 2001-64795 | 3/2001 |
| JP | 2004-097856 | 4/2004 |

* cited by examiner

SYSTEMS AND METHODS FOR ELECTROCHEMICALLY PROCESSING MICROFEATURE WORKPIECES

CROSS-REFERENCE TO RELATED APPLICATIONS

This application claims benefit to U.S. Provisional Application Ser. No. 60/607,460, filed Sep. 3, 2004, which is incorporated herein by reference. The present application is also a continuation-in-part of (a) U.S. patent application Ser. No. 10/729,349 filed on Dec. 5, 2003 now U.S. Pat. No. 7,351,314; (b) U.S. patent application Ser. No. 10/729,357 filed on Dec. 5, 2003 now U.S. Pat. No. 7,351,315; and (c) U.S. patent application Ser. No. 10/861,899 filed Jun. 3, 2004 now U.S. Pat. No. 7,585,398, which is a continuation-in-part of U.S. application Ser. No.: (i) 10/729,349 filed on Dec. 5, 2003 and (ii) U.S. application Ser. No. 10/729,357 filed on Dec. 5, 2003, all of which are incorporated herein by reference.

TECHNICAL FIELD

This application relates to systems and methods for electrochemically processing microfeature workpieces having a plurality of microdevices integrated in and/or on the workpiece. The microdevices can include submicron features. Particular aspects of the present invention are directed toward electrochemical processing systems having water balance units.

BACKGROUND

Microelectronic devices, such as semiconductor devices, imagers and displays, are generally fabricated on and/or in microelectronic workpieces using several different types of machines ("tools"). Many such processing machines have a single processing station that performs one or more procedures on the workpieces. Other processing machines have a plurality of processing stations that perform a series of different procedures on individual workpieces or batches of workpieces. In a typical fabrication process, one or more layers of conductive materials are formed on the workpieces during deposition stages. The workpieces are then typically subject to etching and/or polishing procedures (i.e., planarization) to remove a portion of the deposited conductive layers for forming electrically isolated contacts and/or conductive lines.

Tools that plate metals or other materials onto workpieces are becoming an increasingly useful type of processing machine. Electroplating and electroless plating techniques can be used to deposit copper, solder, permalloy, gold, silver, platinum, electrophoretic resist and other materials onto workpieces for forming blanket layers or patterned layers. A typical copper plating process involves depositing a copper seed layer onto the surface of the workpiece using chemical vapor deposition (CVD), physical vapor deposition (PVD), electroless plating processes, or other suitable methods. After forming the seed layer, a blanket layer or patterned layer of copper is plated onto the workpiece by applying an appropriate electrical potential between the seed layer and an anode in the presence of an electroprocessing solution. The workpiece is then cleaned, etched and/or annealed in subsequent procedures before transferring the workpiece to another processing machine.

Conventional single-wafer processing stations generally include a container for receiving a flow of electroplating solution from a fluid inlet. The processing station can include an anode, a plate-type diffuser having a plurality of apertures, and a workpiece holder for carrying a workpiece. The workpiece holder can include a plurality of electrical contacts for providing electrical current to a seed layer on the surface of the workpiece. When the seed layer is biased with a negative potential relative to the anode, it acts as a cathode. In operation, the electroplating fluid flows around the anode, through the apertures in the diffuser, and against the plating surface of the workpiece. The electroplating solution is an electrolyte that conducts electrical current between the anode and the cathodic seed layer on the surface of the workpiece. Therefore, ions in the electroplating solution plate the surface of the workpiece.

The plating machines used in fabricating microelectronic devices must meet many specific performance criteria. For example, many plating processes must be able to form small contacts in vias or trenches that are less than 0.5 μm wide, and often less than 0.1 μm wide. A combination of organic additives such as "accelerators," "suppressors," and "levelers" can be added to the electroplating solution to improve the plating process within the trenches so that the plating metal fills the trenches from the bottom up. As such, maintaining the proper concentration of organic additives in the electroplating solution is important to properly fill very small features.

One drawback of conventional plating processes is that the organic additives decompose and break down proximate to the surface of the anode. Also, as the organic additives decompose, it is difficult to control the concentration of organic additives and their associated breakdown products in the plating solution, which can result in poor feature filling and nonuniform layers. Moreover, the decomposition of organic additives produces by-products that can cause defects or other nonuniformities. To reduce the rate at which organic additives decompose near the anode, other anodes such as copper-phosphorous anodes can be used.

Another drawback of conventional plating processes is that organic additives and/or chloride ions in the electroplating solution can passivate and/or consume pure copper anodes. This alters the electrical field, which can result in inconsistent processes and nonuniform layers. Thus, there is a need to improve the plating process to reduce the adverse effects of the organic additives.

One existing approach to inhibit organic additives from contacting and passivating the anode is to place a porous barrier between the workpiece and the anode. This approach, however, only reduces the number of additives that decompose proximate to the anode surface. Furthermore, approaches that utilize a barrier to separate the workpiece from the anode can create chemical imbalances in the electroplating solution such that the concentration of one or more of the constituents in the solution is outside of the desired operating range. When the concentration of a component of the electroplating solution is not within the operating range, the plating process may be unsustainable and the processing fluid may need to be replaced. Thus, chemical imbalances can adversely affect the plating process and increase the frequency with which the electroplating solution must be replaced.

SUMMARY

The present invention is directed toward wet chemical processing systems having (a) a deposition chamber with a barrier between processing fluids to mitigate or eliminate the problems caused by organic additives, and (b) a water balance unit to maintain the concentration of water in the processing fluids within a desired range. The deposition chambers are divided into two distinct portions that interact with each other to electroplate a material onto the workpiece while controlling migration of organic additives in the processing fluids across the barrier to avoid the problems caused by the interaction between the organic additives and the anode. The water balance unit removes excess water from the processing fluids, and/or adds water to the fluids based on the composition of the fluids to maintain the concentration of water in the processing fluids within a desired operating range. By maintaining the concentration within a desired range, the life of the individual processing fluids is extended because the fluids may need to be replaced when a constituent (e.g., water) is out of specification. The increased life of the processing fluids allows the tool to operate for a longer period of time before replacing the fluids, which reduces the operating costs and tool downtime.

The chambers include a processing unit for providing a first processing fluid to a workpiece (i.e., working electrode), an electrode unit for conveying a flow of a second processing fluid different than the first processing fluid, and an electrode (i.e., counter electrode) in the electrode unit. The chambers also include a barrier between the first processing fluid and the second processing fluid. The barrier can be a porous, permeable member that permits fluid and small molecules to flow through the barrier between the first and second processing fluids. Alternatively, the barrier can be a nonporous, semipermeable member that prevents fluid flow between the first and second processing fluids while allowing ions to pass between the fluids. In either case, the barrier separates and/or isolates components of the first and second processing fluids from each other such that the first processing fluid can have different chemical characteristics than the second processing fluid. For example, the first processing fluid can be a catholyte having organic additives and the second processing fluid can be an anolyte without organic additives or with a much lower concentration of such additives.

The barrier provides several advantages by substantially preventing the organic additives in the catholyte from migrating to the anolyte. First, because the organic additives are prevented from moving into the anolyte, the organic additives cannot flow past the anodes and decompose into products that interfere with the plating process. Second, because the organic additives do not decompose at the anodes, the anodes are consumed at a much slower rate in the catholyte so that it is less expensive and easier to control the concentration of organic additives in the catholyte. Third, less expensive anodes, such as pure copper anodes, can be used in the anolyte because the risk of passivation is reduced or eliminated.

The barrier, however, does not prevent water molecules from migrating from the anolyte to the catholyte. During electrochemical processing, water is transported across the barrier with current carrying ions in the form of a hydration sphere. As such, the concentration of water in the catholyte increases while the concentration of water in the anolyte decreases. Although water evaporates from the catholyte, the rate at which water molecules pass through the barrier exceeds the evaporation rate. Consequently, the concentration of water in the catholyte can reach undesirable levels. The water balance unit selectively removes water from the catholyte to maintain the concentration of water within a desired range. When the system is idle, water moves through the barrier from the anolyte to the catholyte by osmosis at a rate less than the rate at which the water evaporates from the catholyte. Accordingly, the water balance unit can selectively add water to the catholyte to maintain the concentration of water within a desired range when the system is idle.

The combination of having a barrier to separate the processing fluids and a water balance unit to maintain the concentration of water in the fluids within a desired range will provide a system that is more efficient and produces significantly better quality products. The system is more efficient because using one processing fluid for the workpiece and another processing fluid for the electrode allows the processing fluids to be tailored to the best use in each area without having to compromise to mitigate the adverse effects of using only a single processing solution. As such, the tool does not need to be shut down as often to adjust the fluids and it consumes less constituents. The system produces better quality products because using two different processing fluids allows better control of the concentration of important constituents in each processing fluid.

Moreover, the water balance unit maintains the concentration of water in the processing fluids within a desired operating range. This improves product quality and increases the life of the processing fluids because the fluids may need to be replaced when a constituent (e.g., water) is out of specification. The increased life of the processing fluids (a) reduces the downtime of the tool for replacing the fluids, (b) lowers the operating costs of the tool, and (c) reduces the volume of expensive organic additives that are wasted each time the processing fluid is changed.

DETAILED DESCRIPTION

As used herein, the terms "microfeature workpiece" or "workpiece" refer to substrates on and/or in which microdevices are formed. Typical microdevices include microelectronic circuits or components, thin-film recording heads, data storage elements, microfluidic devices, and other products. Micromachines or micromechanical devices are included within this definition because they are manufactured in much the same manner as integrated circuits. The substrates can be semiconductive pieces (e.g., silicon wafers or gallium arsenide wafers), nonconductive pieces (e.g., various ceramic substrates), or conductive pieces (e.g., doped wafers). Also, the term electrochemical processing or deposition includes electroplating, electro-etching, anodization, and/or electroless plating.

Several embodiments of electrochemical deposition chambers for processing microfeature workpieces are particularly useful for electrolytically depositing metals or electrophoretic resist in and/or on structures of a workpiece. The deposition chambers can accordingly be used in systems for etching, rinsing, or other types of wet chemical processes in the fabrication of microfeatures in and/or on semiconductor substrates or other types of workpieces. Several embodiments of wet chemical processing systems including electrochemical deposition chambers and water balance units are set forth in FIGS. 1-7 and the corresponding text to provide a thorough understanding of particular embodiments of the invention. A person skilled in the art will understand, however, that the invention may have additional embodiments or that the invention may be practiced without several of the details of the embodiments shown in FIGS. 1-7.

A. Embodiments of Wet Chemical Processing Systems

Figure 1:
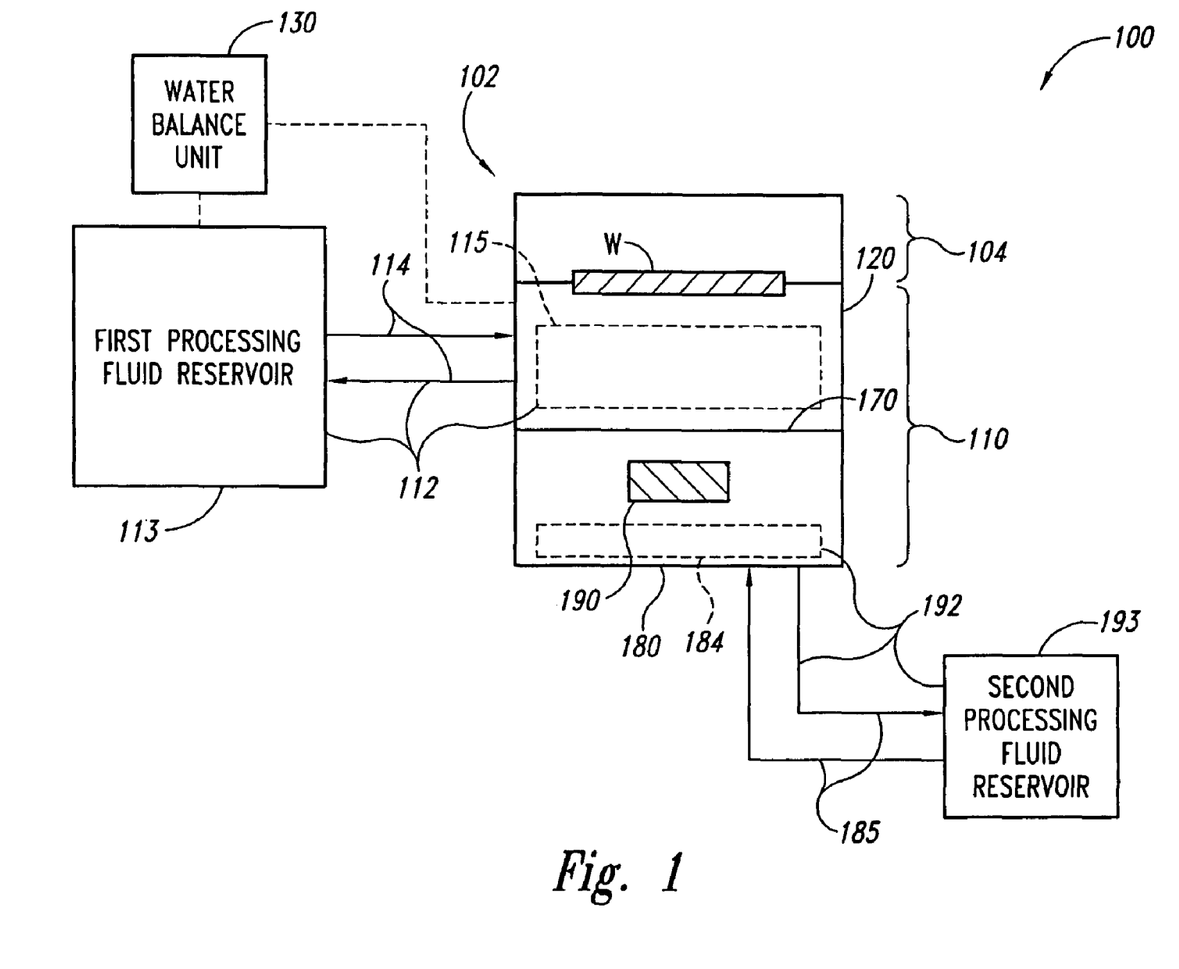
FIG. 1 schematically illustrates a system for wet chemical processing of microfeature workpieces in accordance with one embodiment of the invention.

FIG. 1 schematically illustrates a system 100 for electrochemical deposition, electropolishing, or other wet chemical processing of microfeature workpieces. The system 100 includes an electrochemical deposition chamber 102 having a head assembly 104 (shown schematically) and a wet chemical vessel 110 (shown schematically). The head assembly 104 loads, unloads, and positions a workpiece W or a batch of workpieces at a processing site relative to the vessel 110. The head assembly 104 typically includes a workpiece holder having a contact assembly with a plurality of electrical contacts configured to engage a conductive layer on the workpiece W. The workpiece holder can accordingly apply an electrical potential to the conductive layer on the workpiece W. Suitable head assemblies, workpiece holders, and contact assemblies are disclosed in U.S. Pat. Nos. 6,228,232; 6,280,583; 6,303,010; 6,309,520; 6,309,524; 6,471,913; 6,527,925; 6,569,297; 6,773,560; and 6,780,374, all of which are hereby incorporated by reference in their entirety.

The illustrated vessel 110 includes a processing unit 120 (shown schematically), an electrode unit 180 (shown schematically), and a barrier 170 (shown schematically) between the processing and electrode units 120 and 180. The processing unit 120 is configured to contain a first processing fluid for processing the microfeature workpiece W. The electrode unit 180 is configured to contain an electrode 190 and a second processing fluid at least proximate to the electrode 190. The second processing fluid is generally different than the first processing fluid, but they can be the same in some applications. In general, the first and second processing fluids have some ions in common. The first processing fluid in the processing unit 120 is a catholyte and the second processing fluid in the electrode unit 180 is an anolyte when the workpiece is cathodic. In electropolishing or other deposition processes, however, the first processing fluid can be an anolyte and the second processing fluid can be a catholyte.

The system 100 further includes a first flow system 112 that stores and circulates the first processing fluid and a second flow system 192 that stores and circulates the second processing fluid. The first flow system 112 may include (a) a first processing fluid reservoir 113, (b) a plurality of fluid conduits 114 to convey a flow of the first processing fluid between the first processing fluid reservoir 113 and the processing unit 120, and (c) a plurality of components 115 (shown schematically) in the processing unit 120 to convey a flow of the first processing fluid between the processing site and the barrier 170. The second flow system 192 may include (a) a second processing fluid reservoir 193, (b) a plurality of fluid conduits 185 to convey the flow of the second processing fluid between the second processing fluid reservoir 193 and the electrode unit 180, and (c) a plurality of components 184 (shown schematically) in the electrode unit 180 to convey the flow of the second processing fluid between the electrode 190 and the barrier 170. The concentrations of individual constituents of the first and second processing fluids can be controlled separately in the first and second processing fluid reservoirs 113 and 193, respectively. For example, metals, such as copper, can be added to the first and/or second processing fluid in the respective reservoir 113 or 193. Additionally, the temperature of the first and second processing fluids and/or removal of undesirable materials or bubbles can be controlled separately in the first and second flow systems 112 and 192.

The barrier 170 is positioned between the first and second processing fluids in the region of the interface between the processing unit 120 and the electrode unit 180 to separate and/or isolate the first processing fluid from the second processing fluid. For example, the barrier 170 can be a porous, permeable membrane that permits fluid and small molecules to flow through the barrier 170 between the first and second processing fluids. Alternatively, the barrier 170 can be a nonporous, semipermeable membrane that prevents fluid flow between the first and second flow systems 112 and 192 while selectively allowing ions, such as cations and/or anions, to pass through the barrier 170 between the first and second processing fluids. In either case, the barrier 170 restricts bubbles, particles, and large molecules such as organic additives from passing between the first and second processing fluids. In several embodiments, the system 100 may not include a barrier.

Nonporous barriers, for example, can be substantially free of open area. Consequently, fluid is inhibited from passing through a nonporous barrier when the first and second flow systems 112 and 192 operate at typical pressures. Water, however, can be transported through the nonporous barrier via osmosis and/or electro-osmosis. Osmosis can occur when the molar concentrations in the first and second processing fluids are substantially different. Electro-osmosis can occur as water is carried through the nonporous barrier with current carrying ions in the form of a hydration sphere. When the first and second processing fluids have similar molar concentrations and no electrical current is passed through the processing fluids, fluid flow between the first and second processing fluids is substantially prevented.

The illustrated barrier 170 can also be hydrophilic so that bubbles in the processing fluids do not cause portions of the barrier 170 to dry, which reduces conductivity through the barrier 170. Suitable materials for permeable barriers include polyethersulfone, Gore-tex, Teflon coated woven filaments, polypropylene, glass fritz, silica gels, and other porous polymeric materials. Suitable membrane type (i.e., semipermeable) barriers 170 include NAFION membranes manufactured by DuPont®, Ionac® membranes manufactured by Sybron Chemicals Inc., and NeoSepta membranes manufactured by Tokuyuma.

The system 100 further includes a water balance unit 130 (shown schematically) for maintaining the concentration of water molecules in the first processing fluid within a desired range. The water balance unit 130 can be coupled to the first processing fluid reservoir 113 and/or the processing unit 120. As such, the first processing fluid flows from the first processing fluid reservoir 113 and/or the processing unit 120 to the water balance unit 130. The water balance unit 130 removes or adds water to the first processing fluid to adjust the concentration of water molecules if the concentration is outside the desired range. The first processing fluid then flows from the water balance unit 130 to the first processing fluid reservoir 113 and/or the processing unit 120. In the illustrated embodiment and in the following description, the water balance unit 130 is shown and described as being separate from the first processing fluid reservoir 113. In other embodiments, however, the water balance unit and the first processing fluid reservoir can be combined such that the water balance unit includes a vessel that functions as a reservoir for the first processing fluid. Moreover, the water balance unit 130 can be coupled to the electrode unit 180 and/or the second processing fluid reservoir 193 to maintain the concentration of the second processing fluid within a desired range.

When the system 100 is used for electrochemical processing, an electrical potential can be applied to the electrode 190 and the workpiece W such that the electrode 190 is an anode and the workpiece W is a cathode. The first and second processing fluids are accordingly a catholyte and an anolyte, respectively, and each fluid can include a solution of metal ions to be plated onto the workpiece W. The electrical field between the electrode 190 and the workpiece W may drive positive ions through the barrier 170 from the anolyte to the catholyte, or drive negative ions in the opposite direction. In plating applications, an electrochemical reaction occurs at the microfeature workpiece W in which metal ions are reduced to form a solid layer of metal on the microfeature workpiece W. In electrochemical etching and other electrochemical applications, the electrical field may drive ions in the opposite direction.

During electrochemical processing, water is transported across the barrier 170 with current carrying ions in the form of a hydration sphere. As such, the concentration of water in the catholyte increases while the concentration of water in the anolyte decreases. Although water evaporates from the catholyte, the rate at which water molecules pass through the barrier 170 exceeds the evaporation rate. Consequently, the concentration of water in the catholyte can reach undesirable levels. The water balance unit 130 selectively removes water from the catholyte to maintain the concentration of water in the catholyte within a desired range. The water balance unit 130 may also add water to the anolyte to maintain the concentration of water in the anolyte within a desired range. When the system 100 is idle, water moves through the barrier 170 from the anolyte to the catholyte by osmosis at a rate less than the rate at which the water evaporates from the catholyte. Accordingly, the water balance unit 130 can selectively add water to the catholyte and/or the anolyte to maintain the concentration of water within a desired range when the system 100 is idle.

One feature of the system 100 illustrated in FIG. 1 is that the water balance unit 130 maintains the concentration of water in the first and second processing fluids within a desired operating range. An advantage of this feature is that by maintaining the concentration of water in the processing fluids within a desired range, the life of the individual processing fluids is extended because the fluids may need to be replaced when the constituents (e.g., water) are out of specification. The increased life of the processing fluids (a) reduces the downtime of the system 100 for replacing the fluids, (b) lowers the operating cost of the system 100, and (c) reduces the volume of expensive organic additives that are wasted each time the processing fluid is changed.

Another feature of the system 100 illustrated in FIG. 1 is that the barrier 170 separates the first processing fluid in the first flow system 112 and the second processing fluid in the second flow system 192 from each other, but allows ions and/or small molecules, depending on the type of barrier 170, to pass between the first and second processing fluids. As such, the fluid in the processing unit 120 can have different chemical and/or physical characteristics than the fluid in the electrode unit 180. For example, the first processing fluid can be a catholyte having organic additives and the second processing fluid can be an anolyte without organic additives or with a much lower concentration of such additives. As explained above in the summary section, the lack of organic additives in the anolyte provides the following advantages: (a) reduces by-products of decomposed organics in the catholyte; (b) reduces consumption of the organic additives; (c) reduces passivation of the anode; and (d) enables efficient use of pure copper anodes.

The system 100 illustrated in FIG. 1 is also particularly efficacious in maintaining the desired concentration of copper ions or other metal ions in the first processing fluid. During the electroplating process, it is desirable to accurately control the concentration of materials in the first processing fluid to ensure consistent, repeatable depositions on a large number of individual microfeature workpieces. For example, when copper is deposited on the workpiece W, it is desirable to maintain the concentration of copper in the first processing fluid (e.g., the catholyte) within a desired range to deposit a suitable layer of copper on the workpiece W. This aspect of the system 100 is described in more detail below.

To control the concentration of metal ions in the first processing solution in some electroplating applications, the system 100 illustrated in FIG. 1 uses characteristics of the barrier 170, the volume of the first flow system 112, the volume of the second flow system 192, and the different acid concentrations in the first and second processing solutions. In general, the concentration of acid in the first processing fluid is greater than the concentration of acid in the second processing fluid, and the volume of the first processing fluid in the system 100 is greater than the volume of the second processing fluid in the system 100. As explained in more detail below, these features work together to maintain the concentration of the constituents in the first processing fluid within a desired range to ensure consistent and uniform deposition on the workpiece W. For purposes of illustration, the effect of increasing the concentration of acid in the first processing fluid will be described with reference to an embodiment in which copper is electroplated onto a workpiece. One skilled in the art will recognize that different metals can be electroplated and/or the principles can be applied to different wet chemical processes in other applications. In additional embodiments, however, the concentration of acid in the first processing fluid may not be greater than the concentration of acid in the second processing fluid, and/or the volume of the first processing fluid may not be greater than the volume of the second processing fluid.

Figure 2A:
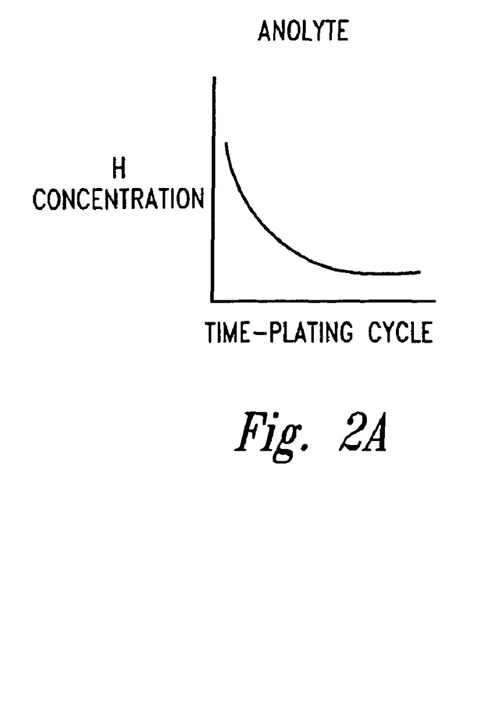
FIGS. 2A-2H graphically illustrate the relationship between the concentration of hydrogen and copper ions in an anolyte and a catholyte during a plating cycle and while the system of FIG. 1 is idle in accordance with one embodiment of the invention.
Figure 2B:
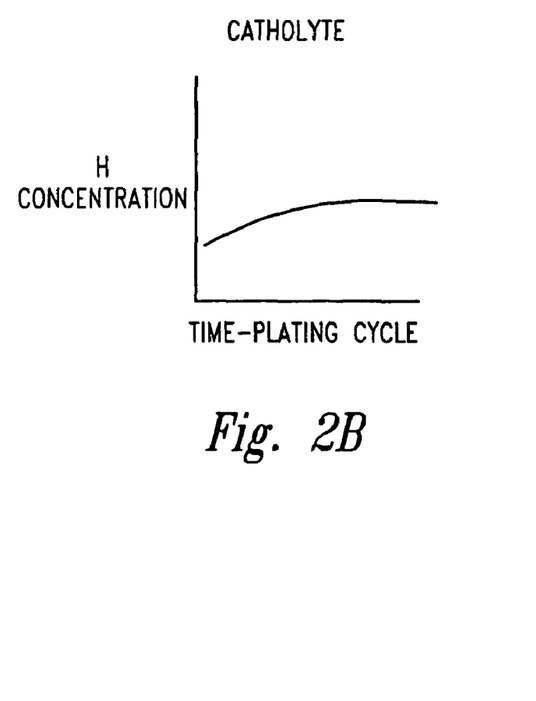

FIGS. 2A-2H graphically illustrate the relationship between the concentrations of hydrogen and copper ions in the anolyte and catholyte during a plating cycle and while the system 100 is idle. FIGS. 2A and 2B show the concentration of hydrogen ions in the second processing fluid (anolyte) and the first processing fluid (catholyte), respectively, during a plating cycle. The electrical field readily drives hydrogen ions across the barrier 170 (FIG. 1) from the anolyte to the catholyte during the plating cycle. Consequently, the concentration of hydrogen ions decreases in the anolyte and increases in the catholyte. As measured by percent concentration change or molarity, the decrease in the concentration of hydrogen ions in the anolyte is generally significantly greater than the corresponding increase in the concentration of hydrogen ions in the catholyte because: (a) the volume of catholyte in the illustrated system 100 is greater than the volume of anolyte; and (b) the concentration of hydrogen ions in the catholyte is much higher than in the anolyte.

Figure 2C:
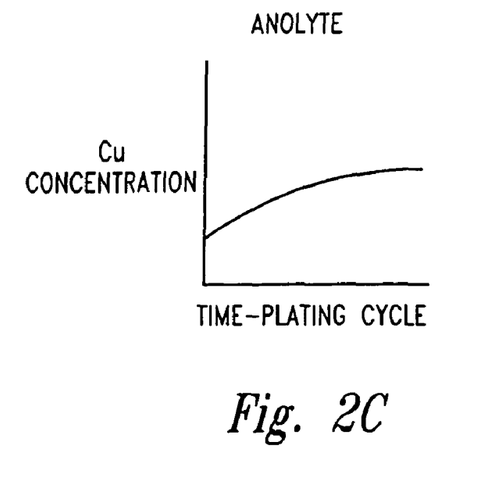
Figure 2D:
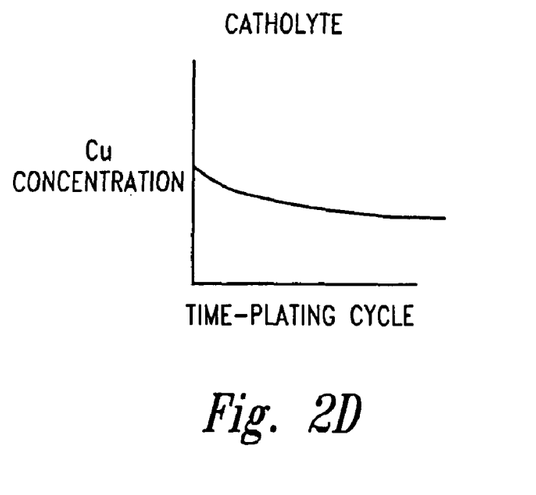

FIGS. 2C and 2D graphically illustrate the concentration of copper ions in the anolyte and catholyte during the plating cycle. During the plating cycle, the anode replenishes copper ions in the anolyte and the electrical field drives the copper ions across the barrier 170 from the anolyte to the catholyte. Thus, as shown in FIG. 2C, the concentration of copper ions in the anolyte increases during the plating cycle. Conversely, in the catholyte cell, FIG. 2D shows that the concentration of copper ions in the catholyte initially decreases during the plating cycle as the copper ions are consumed to form a layer on the microfeature workpiece W.

Figure 2E:
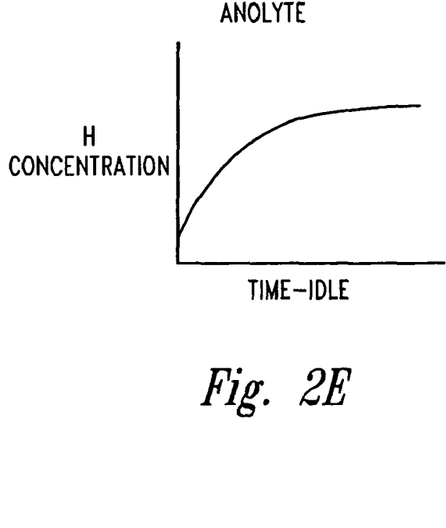
Figure 2F:
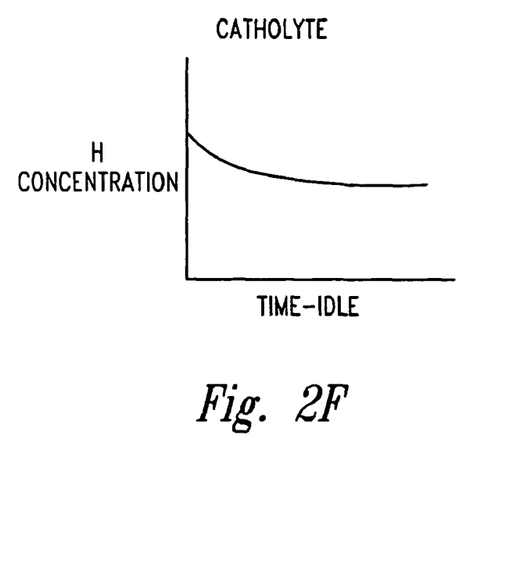
Figure 2G:
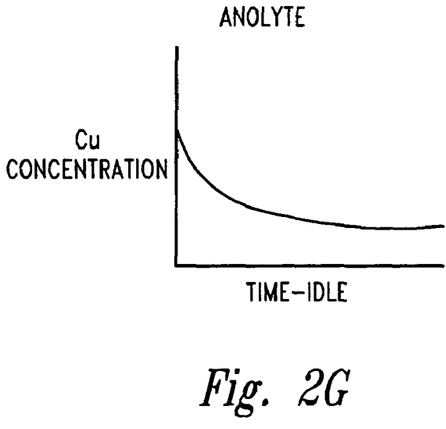
Figure 2H:
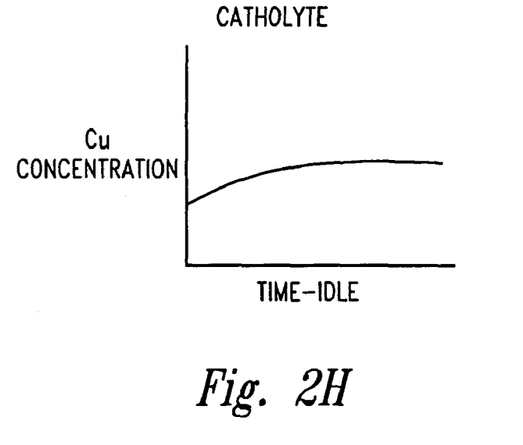

FIGS. 2E-2H graphically illustrate the concentration of hydrogen and copper ions in the anolyte and the catholyte while the system 100 of FIG. 1 is idle. For example, FIGS. 2E and 2F illustrate that the concentration of hydrogen ions increases in the anolyte and decreases in the catholyte while the system 100 is idle because the greater concentration of acid in the catholyte drives hydrogen ions across the barrier 170 to the anolyte. FIGS. 2G and 2H graphically illustrate that the concentration of copper ions decreases in the anolyte and increases in the catholyte while the system 100 is idle. The movement of hydrogen ions into the anolyte creates a charge imbalance that drives copper ions from the anolyte to the catholyte.

One feature of the illustrated embodiment is that when the system 100 is idle, the catholyte is replenished with copper because of the difference in the concentration of acid in the anolyte and catholyte. An advantage of this feature is that the desired concentration of copper in the catholyte can be maintained while the system 100 is idle. Another advantage of this feature is that the increased movement of copper ions across the barrier 170 prevents saturation of the anolyte with copper, which can cause passivation of the anode and/or the formation of salt crystals.

The foregoing operation of the system 100 shown in FIG. 1 occurs, in part, by selecting suitable concentrations of hydrogen ions (i.e., acid protons) and copper. In several useful processes for depositing copper, the acid concentration in the first processing fluid can be approximately 10 g/l to approximately 200 g/l, and the acid concentration in the second processing fluid can be approximately 0.1 g/l to approximately 1.0 g/l. Alternatively, the acid concentration of the first and/or second processing fluids can be outside of these ranges. For example, the first processing fluid can have a first concentration of acid and the second processing fluid can have a second concentration of acid less than the first concentration. The ratio of the first concentration of acid to the second concentration of acid, for example, can be approximately 10:1 to approximately 20,000:1. The concentration of copper is also a parameter. For example, in many copper plating applications, the first and second processing fluids can have a copper concentration of between approximately 10 g/l and approximately 50 g/l. Although the foregoing ranges are useful for many applications, it will be appreciated that the first and second processing fluids can have other concentrations of copper and/or acid.

In other embodiments, the barrier can be anionic and the electrode can be an inert anode (i.e. platinum or iridium oxide) to prevent the accumulation of sulfate ions in the first processing fluid. In this embodiment, the acid concentration or pH in the first and second processing fluids can be similar. Alternatively, the second processing fluid may have a higher concentration of acid to increase the conductivity of the fluid. Copper salt (copper sulfate) can be added to the first processing fluid to replenish the copper in the fluid. Electrical current can be carried through the barrier by the passage of sulfate anions from the first processing fluid to the second processing fluid. Therefore, sulfate ions are less likely to accumulate in the first processing fluid where they can adversely affect the deposited film.

In other embodiments, the system can electrochemically etch copper from the workpiece. In these embodiments, the first processing solution (the anolyte) contains an electrolyte that may include copper ions. During electrochemical etching, an electrical potential can be applied to the electrode and/or the workpiece. An anionic barrier can be used to prevent positive ions (such as copper) from passing into the second processing fluid (catholyte). Consequently, the current is carried by anions, and copper ions are inhibited from flowing proximate to and being deposited on the electrode.

The foregoing operation of the illustrated system 100 also occurs by selecting suitable volumes of anolyte and catholyte. Referring back to FIG. 1, another feature of the illustrated embodiment is that the system 100 has (a) a first volume of the first processing fluid in the first flow system 112, the first processing fluid reservoir 113, and the water balance unit 130, and (b) a second volume of the second processing fluid in the second flow system 192 and the second processing fluid reservoir 193. The ratio between the first volume and the second volume can be approximately 1.5:1 to 20:1, and in many applications is approximately 2:1, 3:1, 4:1, 5:1, 6:1, 7:1, 8:1, 9:1 or 10:1. The difference in volume in the first and second processing fluids moderates the change in the concentration of materials in the first processing fluid. For example, as described above with reference to FIGS. 2A and 2B, when hydrogen ions move from the anolyte to the catholyte, the percentage change in the concentration of hydrogen ions in the catholyte is less than the change in the concentration of hydrogen ions in the anolyte because the volume of catholyte is greater than the volume of anolyte. In other embodiments, the first and second volumes can be approximately the same.

B. Additional Embodiments of Wet Chemical Processing Systems

Figure 3:
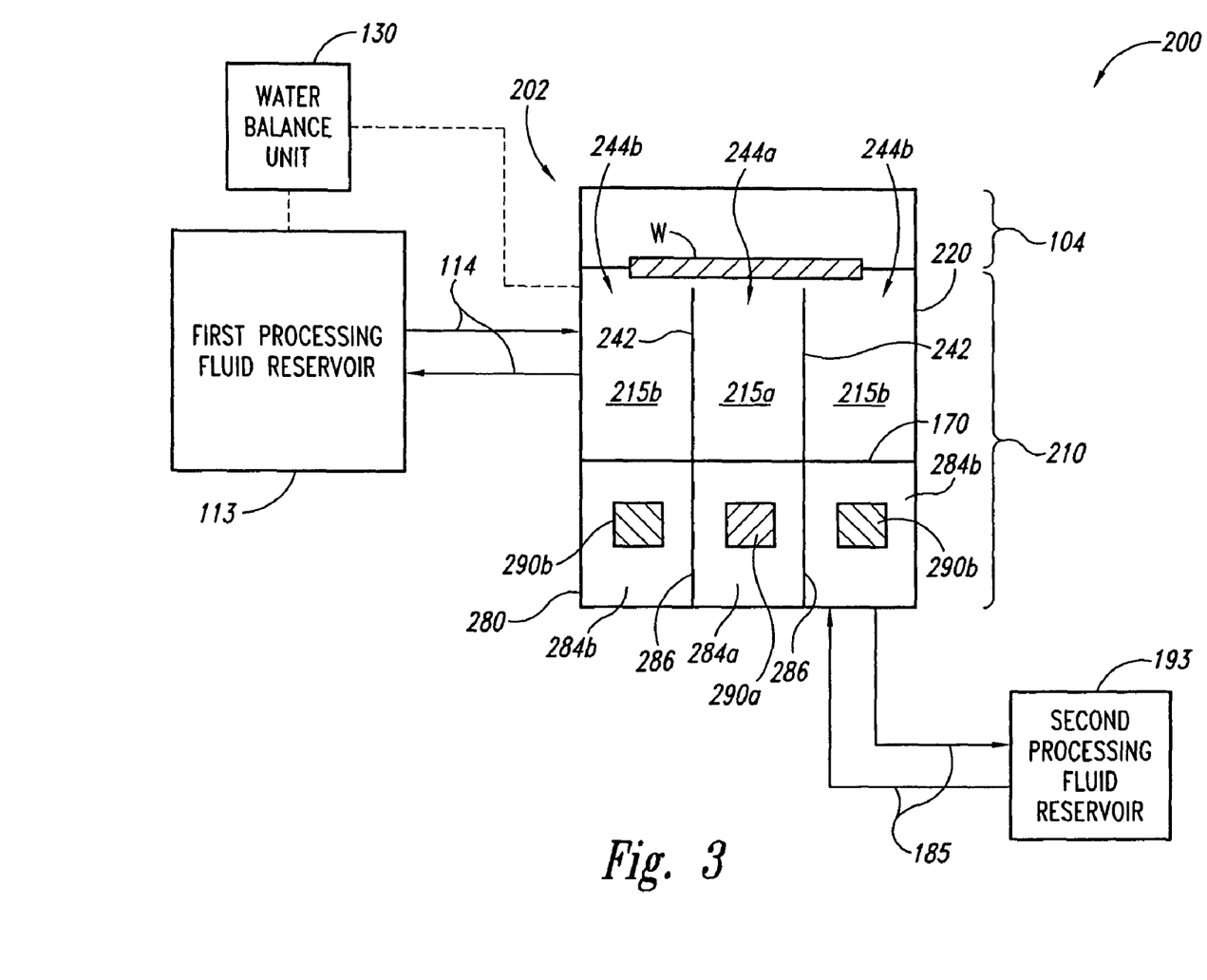
FIG. 3 schematically illustrates a system for wet chemical processing of microfeature workpieces in accordance with another embodiment of the invention.

FIG. 3 schematically illustrates a system 200 for wet chemical processing of microfeature workpieces in accordance with another embodiment of the invention. The system 200 is generally similar to the system 100 described above with reference to FIG. 1. For example, the illustrated system 200 includes an electrochemical deposition chamber 202, a first processing fluid reservoir 113, a second processing fluid reservoir 193, and a water balance unit 130 in fluid communication with the first reservoir 113 and/or chamber 202 for maintaining the concentration of water in the first processing fluid within a desired range.

The deposition chamber 202 has a wet chemical vessel 210 (shown schematically) with a processing unit 220 (shown schematically), an electrode unit 280 (shown schematically), and a barrier 170 (shown schematically) between the processing and electrode units 220 and 280. The processing unit 220 of the illustrated embodiment includes a dielectric divider 242 projecting from the barrier 170 toward the processing site and a plurality of chambers 215 (identified individually as 215a-b) defined by the dielectric divider 242. The chambers 215a-b can be arranged concentrically and have corresponding openings 244a-b proximate to the processing site. The chambers 215a-b are configured to convey the first processing fluid to/from the microfeature workpiece W. In other embodiments, the processing unit 220 may not include the dielectric divider 242 and the chambers 215, or the dielectric divider 242 and the chambers 215 may have other configurations.

The illustrated electrode unit 280 includes a dielectric divider 286, a plurality of compartments 284 (identified individually as 284a-b) defined by the dielectric divider 286, and a plurality of electrodes 290 (identified individually as 290a-b) disposed within corresponding compartments 284. The compartments 284 can be arranged concentrically and configured to convey the second processing fluid at least proximate to the electrodes 290. Although the illustrated system 200 includes two concentric electrodes 290, in other embodiments, systems can include a different number of electrodes and/or the electrodes can be arranged in a different configuration.

When the system 200 is used for electrochemical processing, an electrical potential can be applied to the electrodes 290 and the workpiece W such that the electrodes 290 are anodes and the workpiece W is a cathode. The first electrode 290a provides an electrical field to the workpiece W at the processing site through the portion of the second processing fluid in the first compartment 284a of the electrode unit 280 and the portion of the first processing fluid in the first chamber 230a of the processing unit 220. Accordingly, the first electrode 290a provides an electrical field that is effectively exposed to the processing site via the first opening 244a. The first opening 244a shapes the electrical field of the first electrode 290a to create a "virtual electrode" at the top of the first opening 244a. This is a "virtual electrode" because the dielectric divider 242 shapes the electrical field of the first electrode 290a so that the effect is as if the first electrode 290a were placed in the first opening 244a. Virtual electrodes are described in detail in U.S. patent application Ser. No. 09/872,151, which is hereby incorporated by reference in its entirety. Similarly, the second electrode 290b provides an electrical field to the workpiece W through the portion of the second processing fluid in the second compartment 284b of the electrode unit 280 and the portion of the first processing fluid in the second chamber 230b of the processing unit 220. Accordingly, the second electrode 290b provides an electrical field that is effectively exposed to the processing site via the second opening 244b to create another "virtual electrode."

In operation, a first current is applied to the first electrode 290a and a second current is applied to the second electrode 290b. The first and second electrical currents are controlled independently of each other such that they can be the same or different than each other at any given time. Additionally, the first and second electrical currents can be dynamically varied throughout a plating cycle. The first and second electrodes 290a-b accordingly provide a highly controlled electrical field to compensate for inconsistent or non-uniform seed layers as well as changes in the plated layer during a plating cycle.

C. Embodiments of Water Balance Units

Figure 4:
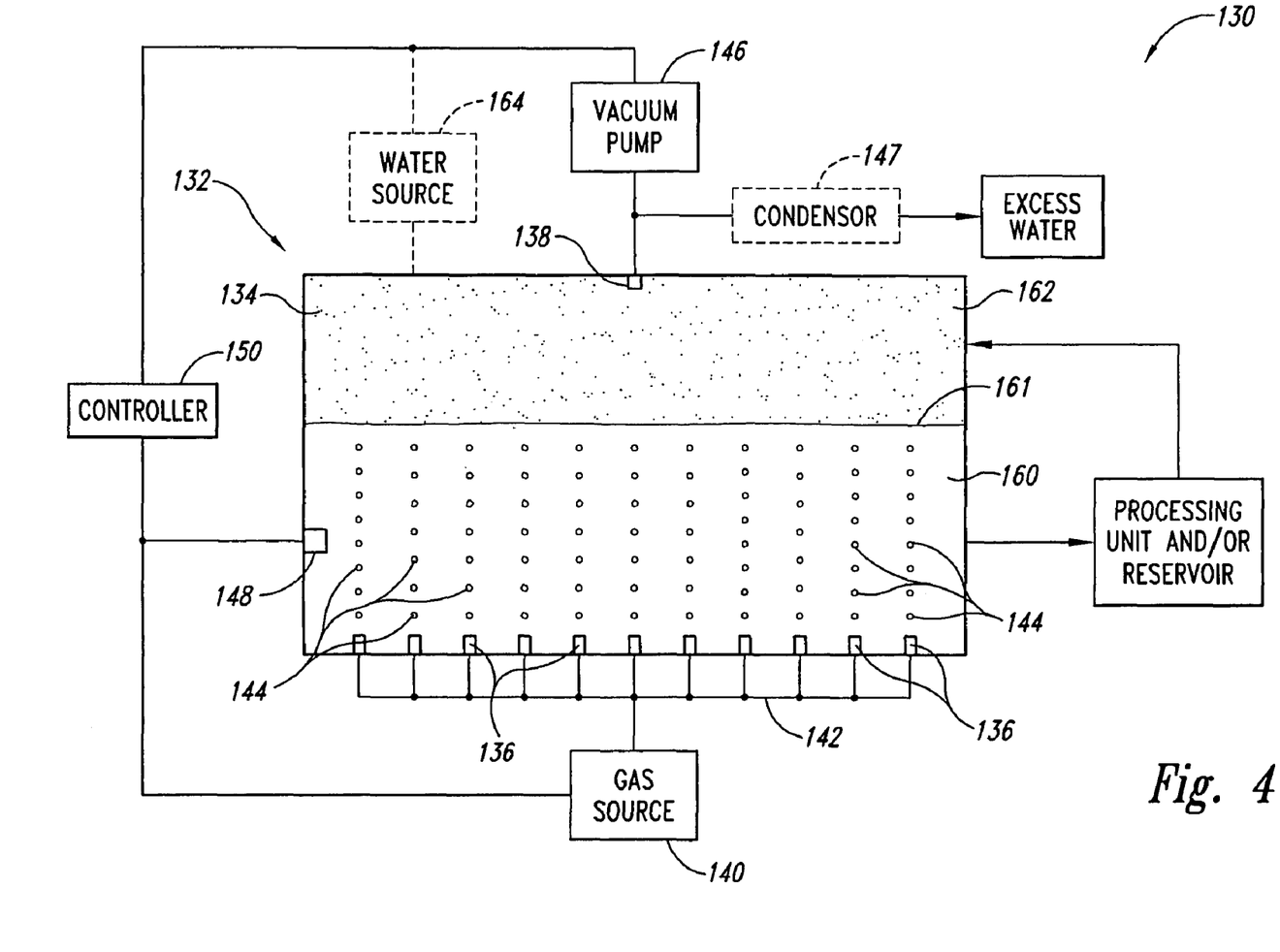
FIG. 4 is a schematic view of a water balance unit in accordance with another embodiment of the invention.

FIG. 4 is a schematic view of a water balance unit 130 in accordance with one embodiment of the invention. The illustrated water balance unit 130 includes a vessel 132 for containing a first processing fluid 160, a gas source 140 (shown schematically) for providing gas to the vessel 132 to vaporize water in the first processing fluid 160, and a vacuum pump 146 (shown schematically) for exhausting the gas and vaporized water from the vessel 132. The vessel 132 has an interior volume configured to receive the first processing fluid 160 with a headspace 134 above the fluid 160. The vessel 132 further includes a plurality of inlets 136 coupled to the gas source 140 by gas lines 142. The inlets 136 are positioned for flowing gas into the first processing fluid 160 to increase the surface area of the first processing fluid 160 exposed to a gas. Because the exposed surface area of the first processing fluid 160 is generally proportional to the rate at which the water in the first processing fluid 160 vaporizes, flowing gas into the first processing fluid 160 increases the vaporization rate of the water in the fluid 160.

In the illustrated water balance unit 130, the inlets 136 are positioned at the bottom of the vessel 132 so that gas bubbles 144 flow from the bottom of the first processing fluid 160 to the top of the fluid 160. This arrangement increases the surface area of the first processing fluid 160 exposed to the gas because the gas bubbles 144 travel the entire height of the fluid 160. In additional embodiments, however, the vessel may include a different number of inlets, and/or the inlets can be positioned in a different arrangement to flow gas into the first processing fluid 160 in the vessel. For example, the inlets can be positioned in the sidewalls of the vessel below a surface of the first processing fluid. The type of gas can also be selected to further increase the rate at which water in the first processing fluid vaporizes. For example, the gas can be a dehumidified gas and/or a heated gas, such as nitrogen or other suitable gases.

The headspace 134 of the vessel 132 fills with gas and water vapor 162 as the gas bubbles 144 travel through the first processing fluid 160. The water molecules at a surface 161 of the first processing fluid 160 are exposed to the gas in the headspace 134, which also increases the vaporization rate of the water. The vacuum pump 146 exhausts the gas and water vapor 162 from the headspace 134 via an outlet 138 in the vessel 132. In doing so, the vacuum pump 140 may create a negative pressure in the headspace 134 to further increase the vaporization rate of the water molecules at the surface 161 of the first processing fluid 160. The water balance unit 130 may also include a condenser 147 (shown schematically in broken lines) to condense the water vapor and separate the water from the gas.

The illustrated water balance unit 130 further includes a sensor 148 (shown schematically) for detecting the concentration of water in the first processing fluid 160 and a controller 150 (shown schematically) operably coupled to the sensor 148, gas source 140, and vacuum pump 146 for maintaining the concentration of water in the first processing fluid 160 within a desired range. After the sensor 148 detects the concentration of water in the first processing fluid 160, the controller 150 can transmit signals to (a) the gas source 140 for controlling the flow of gas into the vessel 132, and/or (b) the vacuum pump 146 for controlling the flow of water vapor 162 out of the headspace 134. By adjusting the flow of gas into the vessel 132 and/or the flow of gas and water vapor 162 out of the vessel 132, the controller 150 can adjust the concentration of water in the first processing fluid 160. For example, if the sensor 148 detects a concentration of water that exceeds the desired range, the controller 150 directs (a) the gas source 140 to increase the flow of gas into vessel 132 and/or (b) the vacuum pump 146 to increase the flow of gas and water vapor 162 out of the vessel 132 to reduce the concentration of water in the first processing fluid 160. In contrast, if the sensor 148 detects a concentration of water less than the desired range, the controller 150 directs (a) the gas source 140 to decrease or stop the flow of gas into vessel 132 and/or (b) the vacuum pump 146 to decrease or stop the flow of gas and water vapor 162 out of the vessel 132 to increase the concentration of water in the first processing fluid 160. Although in the illustrated embodiment the sensor 148 is positioned in the vessel 132, in other embodiments, the sensor 148 can be positioned in the processing unit 120 (FIG. 1), the first processing fluid reservoir 113 (FIG. 1), and/or any of the fluid conduits that convey the first processing fluid 160.

The water balance unit 130 may optionally include a water source 164 (shown schematically) for adding make-up water to the vessel 132 when the concentration of water in the first processing fluid 160 is below the desired range. In other embodiments, the water source 164 can be coupled to the first processing fluid reservoir 113 (FIG. 1) and/or the processing unit 120 (FIG. 1) for adding water directly to the reservoir 113 and/or the processing unit 120. The system 100 (FIG. 1) may also include a degassing device (not shown) to remove bubbles from the first processing fluid 160 before the fluid 160 flows into the processing unit 120.

One feature of the water balance unit 130 illustrated in FIG. 4 is that the inlets 136 flow gas into the first processing fluid 160 to increase the surface area of the fluid 160 exposed to the gas. Because the gas flows through the first processing fluid 160, the surface area of the fluid 160 exposed to the gas is greater than the transverse cross-sectional area of the vessel 132. An advantage of this feature is the vaporization rate of water molecules in the first processing fluid 160 is increased because the vaporization rate is generally proportional to the exposed surface area of the first processing fluid 160. As such, by controlling the flow of gas into the vessel 132, the concentration of water in the first processing fluid 160 can be maintained within a desired range.

Figure 5:
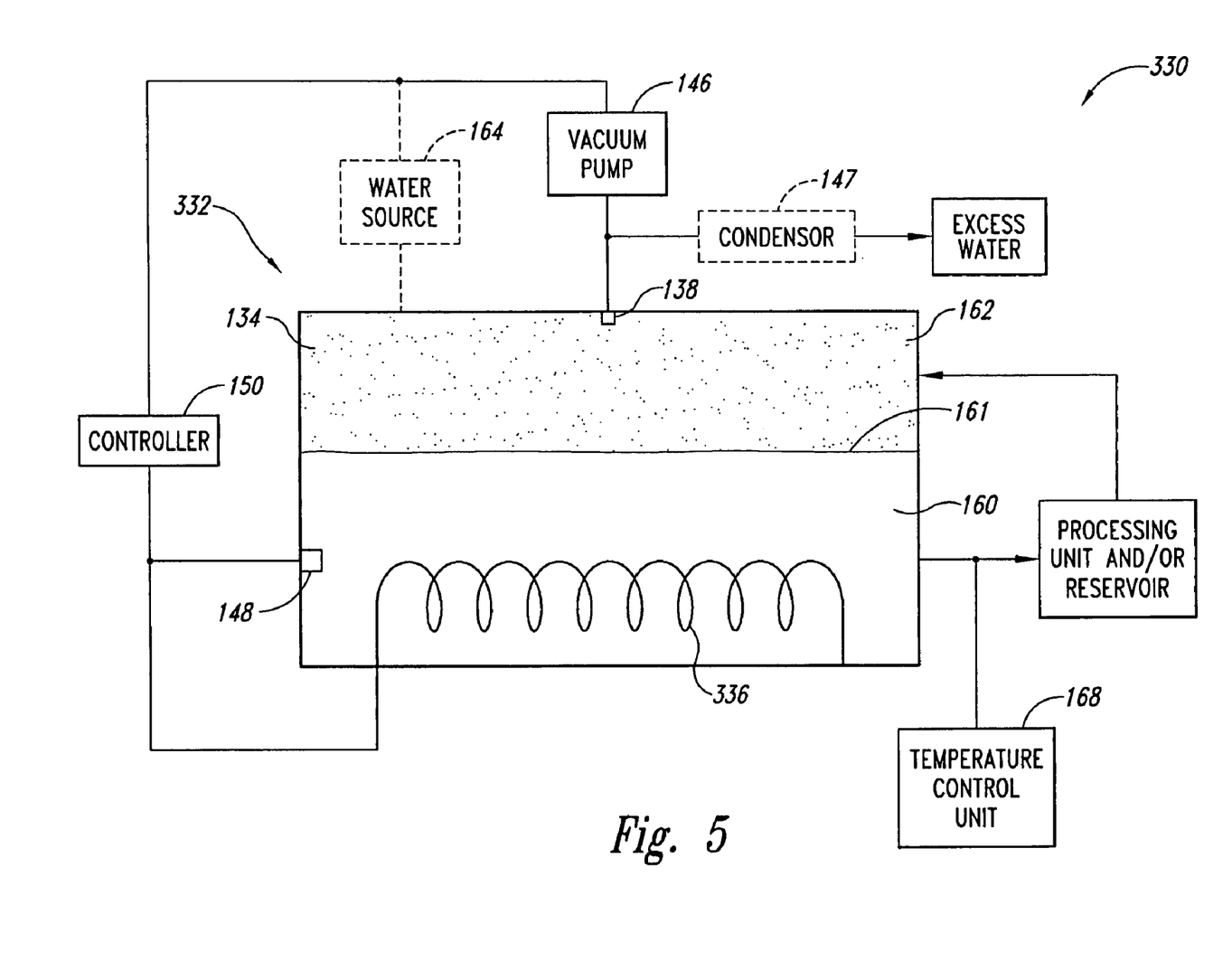
FIG. 5 is a schematic view of a water balance unit in accordance with another embodiment of the invention.

FIG. 5 is a schematic view of a water balance unit 330 in accordance with another embodiment of the invention. The water balance unit 330 is generally similar to the water balance unit 130 described above with reference to FIG. 4. For example, the water balance unit 330 includes a vessel 332 having an interior volume configured to contain a first processing fluid 160 and a headspace 134 above the fluid 160. The illustrated water balance unit 330, however, includes a heating element 336 positioned in the vessel 332 to heat the first processing fluid 160. Heating the first processing fluid 160 increases the vaporization rate of water molecules in the fluid 160.

In the illustrated embodiment, the controller 150 is operably coupled to the heating element 336, the vacuum pump 146, and the sensor 148 for maintaining the concentration of water molecules in the first processing fluid 160 within a desired range. For example, when the sensor 148 detects a water concentration that exceeds the desired range, the controller 150 transmits signals to (a) the heating element 336 to increase the temperature of the first processing fluid 160 and/or (b) the vacuum pump 140 to increase the flow of gas and water vapor 162 out of the headspace 134. Similarly, when the sensor 148 detects a water concentration less than the desired range, the controller 150 transmits signals for (a) reducing the heat generated by the heating element 336 and/or (b) reducing the flow of gas and water vapor 162 from the headspace 134. As such, the illustrated water balance unit 330 maintains the concentration of water molecules in the first processing fluid 160 within a desired range.

In several applications, while maintaining the concentration of the water molecules in the first processing fluid 160 within the desired range, the heating element 336 heats the first processing fluid 160 to a desired operating temperature for electrochemical processing in the processing unit 120 (FIG. 1). In other applications, however, the heating element 336 may heat the first processing fluid 160 to a temperature that exceeds the desired operating temperature. As such, the system 100 (FIG. 1) can include a temperature control unit 168 (shown schematically in FIG. 5) in the fluid conduits 114 (FIG. 1) and/or the first processing fluid reservoir 113 (FIG. 1) to adjust the temperature of the first processing fluid 160 to the desired operating temperature before the fluid 160 enters the processing unit 120.

Figure 6:
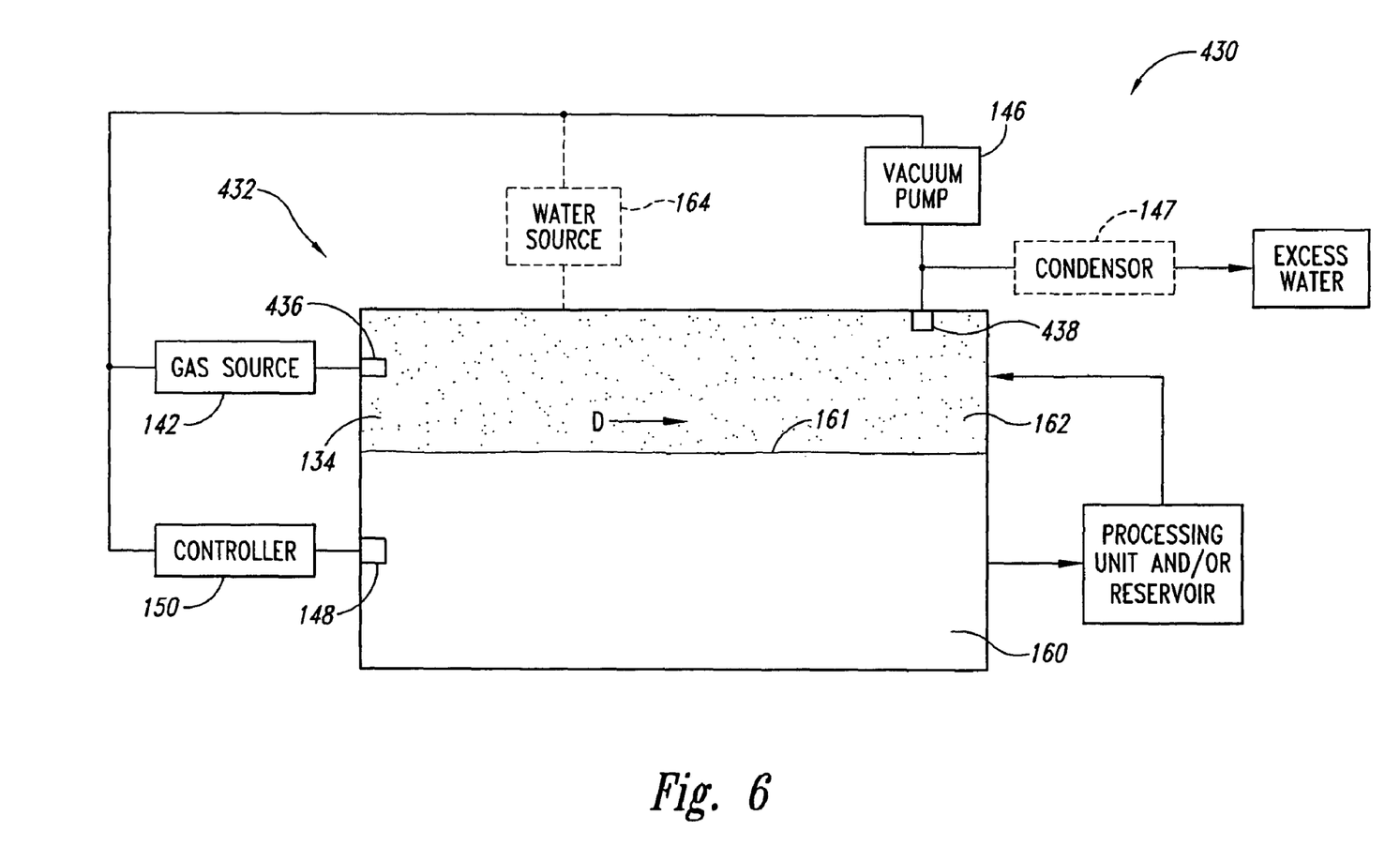
FIG. 6 is a schematic view of a water balance unit in accordance with another embodiment of the invention.

FIG. 6 is a schematic view of a water balance unit 430 in accordance with another embodiment of the invention. The water balance unit 430 can be generally similar to the water balance unit 130 described above with reference to FIG. 3. For example, the water balance unit 430 can include a vessel 432 having an interior volume configured to receive the first processing fluid 160 with a headspace 134 above the fluid 160. The illustrated vessel 432, however, includes an inlet 436 positioned in the headspace 134 and operably coupled to the gas source 142 for flowing gas over the surface 161 of the first processing fluid 160. Flowing gas over the surface 161 of the first processing fluid 160 increases the vaporization rate of the water molecules at the surface 161 of the fluid 160.

The illustrated vessel 432 further includes an outlet 438 positioned in the headspace 134 and operably coupled to the vacuum pump 146 for exhausting the gas and water vapor 162 from the headspace 134. As such, the gas flows over the surface 161 of the first processing fluid 160 and through the headspace 134 in a direction D. The controller 150 is operably coupled to the gas source 142 to vary the flow of gas across the surface 161 of the processing fluid 160 for maintaining the concentration of water within a desired range. For example, when the sensor 148 detects a water concentration that exceeds the desired range, the controller 150 transmits signals to the gas source 142 to increase the flow of gas across the surface 161 of the first processing fluid 160. In contrast, when the sensor 148 detects a water concentration less than the desired range, the controller 150 transmits signals to (a) the gas source 142 to reduce or stop the flow of gas across the surface 161 of the first processing fluid 160 and/or (b) the water source 164 to add water to the first processing fluid 160. As such, the illustrated water balance unit 430 maintains the concentration of water molecules in the first processing fluid 160 within a desired range.

One feature of the water balance unit 430 illustrated in FIG. 6 is that the gas flows over the surface 161 of the first processing fluid 160 and does not flow through the fluid 160. An advantage of this feature is that the water balance unit 430 does not introduce bubbles into the first processing fluid 160 that must be removed by degassing the fluid 160 before processing. Bubbles in the first processing fluid 160 can adversely affect the plating process because a bubble may become trapped against the workpiece and impede deposition on that portion of the workpiece.

In other embodiments, vessels may have several inlets and/or outlets arranged in different configurations for flowing gas across the surface 161 of the first processing fluid 160. For example, in several embodiments, a vessel can include a plurality of inlets positioned around the perimeter of the headspace and an outlet positioned proximate to the center of the headspace such that gas flows inward from the inlets toward the outlet. Alternatively, a vessel can include a plurality of outlets positioned around the perimeter of the headspace and an inlet positioned at the center of the headspace such that gas flows outward from the inlet toward the outlets. In additional embodiments, the water balance unit 430 may not include the gas source 142 and/or the vacuum pump 146. In such embodiments, the exposure of the surface 161 of the first processing fluid 160 to ambient air may increase the vaporization rate of water sufficiently such that there is no need to flow gas through the vessel.

Figure 7:
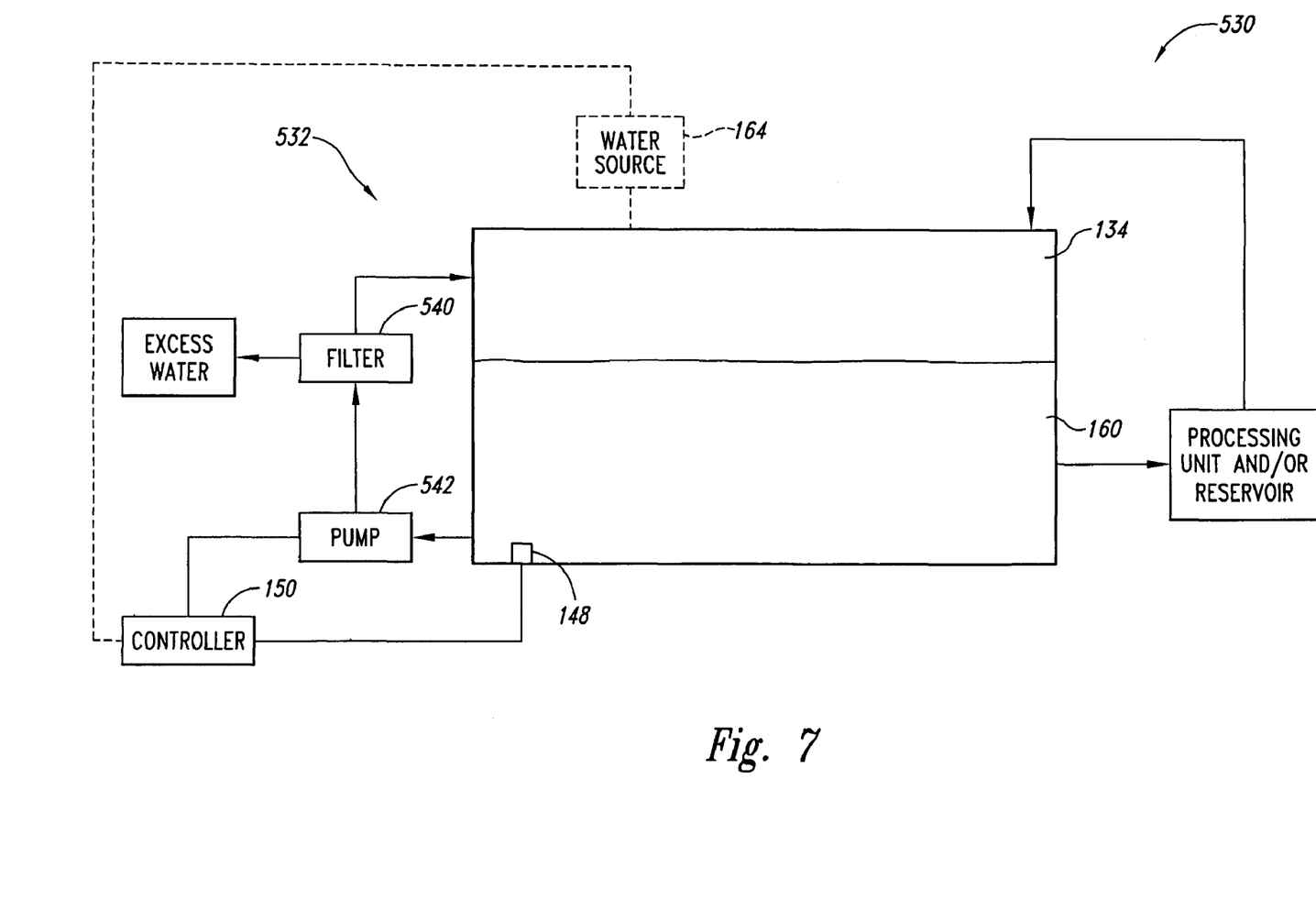
FIG. 7 is a schematic view of a water balance unit in accordance with another embodiment of the invention.

FIG. 7 is a schematic view of a water balance unit 530 in accordance with another embodiment of the invention. The illustrated water balance unit 530 includes a vessel 532 for receiving the first processing fluid 160, a filter 540 for removing water molecules from the first processing fluid 160, and a pump 542 for driving the first processing fluid 160 through the filter 540. The filter 540 can be a reverse osmosis filter to remove water from the first processing fluid 160. The controller 150 is operably coupled to the pump 542 to vary the flow of the first processing fluid 160 through the filter 540 for maintaining the concentration of water within a desired range. For example, when the sensor 148 detects a water concentration that exceeds the desired range, the controller 150 transmits signals to the pump 542 to increase the flow of the first processing fluid 160 through the filter 540, which increases the volume of water removed from the fluid 160. In contrast, when the sensor 148 detects a water concentration less than the desired range, the controller 150 transmits signals to the pump 542 to decrease or stop the flow of the first processing fluid 160 through the filter 540, which reduces or stops the removal of water from the fluid 160. As such, the illustrated water balance unit 530 maintains the concentration of water molecules in the first processing fluid 160 within a desired range.

From the foregoing, it will be appreciated that specific embodiments of the invention have been described herein for purposes of illustration, but that various modifications may be made without deviating from the spirit and scope of the invention. For example, in several embodiments, the components of one water balance unit described above with reference to FIGS. 4-7 can be combined with one or more of the components of another water balance unit. In one such embodiment, the water balance unit 430 illustrated in FIG. 6 can further include the heating element 336 illustrated in FIG. 5 in the vessel 432. In other embodiments, the water balance unit 130 illustrated in FIG. 4 can also include one or more inlets, such as the inlet 436 illustrated in FIG. 6, positioned to flow gas over the surface 161 of the first processing fluid 160. Accordingly, the invention is not limited except as by the appended claims.

I claim:

1. A system for wet chemical processing of microfeature workpieces, the system comprising:
   a processing unit for conveying a first processing fluid to a microfeature workpiece;
   an electrode unit coupled to the processing unit, the electrode unit including an electrode and being configured for conveying a second processing fluid proximate to the electrode;
   a barrier between the processing unit and the electrode unit to inhibit selected matter from passing between the first and second processing fluids;
   a vessel in fluid communication with the processing unit, the vessel configured for containing the first processing fluid;
   a gas inlet positioned to flow gas over a surface of the first processing fluid in the vessel for vaporizing water in the first processing fluid;
   a vacuum source positioned to draw off the gas and vaporized water out of the vessel;
   a sensor for detecting a concentration of water in the first processing fluid;
   a water source for adding water to the first processing fluid; and
   a controller coupled to the sensor and the water source for controlling addition of water to the first processing fluid based on the detected concentration of water in the first processing fluid.

2. The system of claim 1 wherein the barrier comprises a nonporous barrier configured to inhibit cations or anions from passing between the first and second processing fluids.

3. The system of claim 1 wherein the barrier comprises a porous barrier that permits fluid flow between the first and second processing fluids.

4. The system of claim 1 wherein the electrode is a first electrode, and wherein the electrode unit further comprises a second electrode arranged concentrically with the first electrode and operable independent of the first electrode.

5. The system of claim 1 wherein:
   the electrode is a first electrode;
   the electrode unit further comprises a second electrode arranged concentrically with the first electrode; and
   the processing unit comprises a field shaping module, the field shaping module being composed of a dielectric material and having a first opening facing a first section of the processing site through which ions influenced by the first electrode can pass and a second opening facing a second section of the processing site through which ions influenced by the second electrode can pass.

6. The system of claim 1 with a temperature control unit associated with the vessel for adjusting temperature of the processing fluid.

7. A system for wet chemical processing of microfeature workpieces, the system comprising:
   a processing unit having a first flow system configured to convey a first electrolyte to a microfeature workpiece;
   a first reservoir operatively coupled to the first flow system of the processing unit, the first reservoir configured for containing the first electrolyte;
   an electrode unit coupled to the processing unit, the electrode unit including an electrode and a second flow system configured to convey a second electrolyte proximate to the electrode;
   a second reservoir operatively coupled to the second flow system of the electrode unit, the second reservoir configured for containing the second electrolyte;
   a barrier between the processing unit and the electrode unit to inhibit selected matter from passing between the first and second electrolytes; and
   a vessel configured for containing the first electrolyte and associated with the first reservoir;
   a gas inlet positioned in the vessel to flow gas over an electrolyte surface in the vessel;
   a vacuum source coupled to the vessel; and
   a temperature control unit capable of both heating and cooling the first electrolyte.

8. The system of claim 7 further comprising:
   a sensor in the vessel for detecting the concentration of water in the first electrolyte;
   a water source for flowing water into the first electrolyte; and
   a controller operably coupled to the sensor and the water source for controlling the flow of water into the first electrolyte based on the detected concentration of water in the first electrolyte.

9. A method of electrochemically processing a microfeature workpiece, the method comprising:
   flowing a first processing fluid at least proximate to a microfeature workpiece in a reaction chamber;
   flowing a second processing fluid at least proximate to an electrode in the reaction chamber;
   applying an electrical current to the electrode to establish an electrical current flow in the first and second processing fluids;
   separating the first processing fluid and the second processing fluid with a barrier;
   maintaining a concentration of water in the first processing fluid within a desired range during processing by flowing a as over a surface of the first processing fluid to remove water from the first processing fluid;
   detecting the concentration of water in the first processing fluid; and
   adding water to the first processing fluid if the detected concentration of water is below a desired range.

10. The method of claim 9 wherein separating the first and second processing fluids comprises inhibiting organic additives from passing between the first and second processing fluids with a porous barrier.

11. The method of claim 9 wherein separating the first and second processing fluids comprises separating the flow of the first processing fluid from the flow of the second processing fluid with a semipermeable barrier.

12. The method of claim 9 further comprising holding the first processing fluid in a vessel and exhausting vaporized water from the vessel.

13. A method of electrochemically processing a microfeature workpiece, the method comprising:

flowing a first processing fluid at least proximate to a microfeature workpiece in a reaction chamber;

flowing a second processing fluid at least proximate to a plurality of electrodes in the reaction chamber;

applying independent electrical currents to individual electrodes to establish an electrical current flow in the first and second processing fluids;

separating the first processing fluid and the second processing fluid with a barrier;

maintaining a desired amount of water in the first processing fluid by:

containing the first processing fluid in a vessel;

flowing a gas over a surface of the first processing fluid in the vessel, to vaporize water, and exhausting the vaporized water from the vessel;

detecting the concentration of water in the first processing fluid; and adding water to the first processing fluid if the detected concentration of water is below a desired range.

14. A processing system comprising:

a processing unit having first fluid passages for conveying a first processing fluid to a workpiece;

an electrode unit coupled to a processing unit, the electrode unit including an electrode and having second fluid passages for conveying a second processing fluid to the electrode;

a barrier between the processing unit and the electrode unit to inhibit selected matter from passing between the first and second processing fluids;

a gas inlet positioned to flow gas over a surface of the first processing fluid for vaporizing water in the first processing fluid;

a vacuum source positioned to exhaust water vaporized from the first processing fluid;

a sensor positioned for detecting a concentration of water in the first processing fluid;

a water source positioned to add water to the first processing fluid; and a controller electrically coupled to the sensor and the water source for controlling addition of water to the first processing fluid based on the detected concentration of water in the first processing fluid.

15. The processing system of claim 14 further comprising a temperature control unit for adjusting temperature of the first processing fluid.

* * * * *